United States Patent
Seidel et al.

(10) Patent No.: US 10,630,088 B2
(45) Date of Patent: *Apr. 21, 2020

(54) BATTERY CHARGING DEVICE

(71) Applicant: Robert Bosch GmbH, Stuttgart (DE)

(72) Inventors: Thorsten Seidel, Remseck (DE); Alexander Osswald, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 297 days.

This patent is subject to a terminal disclaimer.

(21) Appl. No.: 14/486,674

(22) Filed: Sep. 15, 2014

(65) Prior Publication Data

US 2015/0077043 A1    Mar. 19, 2015

(30) Foreign Application Priority Data

Sep. 16, 2013 (DE) .................. 10 2013 218 533

(51) Int. Cl.
| | |
|---|---|
| *H02J 7/00* | (2006.01) |
| *H05K 5/06* | (2006.01) |
| *H05K 7/20* | (2006.01) |
| *H05K 7/14* | (2006.01) |

(52) U.S. Cl.
CPC ............. *H02J 7/0029* (2013.01); *H02J 7/00* (2013.01); *H02J 7/0042* (2013.01); *H02J 7/0045* (2013.01); *H05K 5/061* (2013.01); *H05K 7/1432* (2013.01); *H05K 7/20918* (2013.01)

(58) Field of Classification Search
USPC ....................................... 320/107
See application file for complete search history.

(56) References Cited

U.S. PATENT DOCUMENTS

| | | | |
|---|---|---|---|
| 7,576,513 B1* | 8/2009 | Nierescher | H01M 10/44 320/107 |
| 8,188,714 B2* | 5/2012 | Petrick | G06F 1/1628 320/107 |
| 2003/0117107 A1* | 6/2003 | Zick | H01M 2/1016 320/112 |
| 2005/0024012 A1* | 2/2005 | Astrauskas | H02J 9/005 320/107 |
| 2006/0043926 A1* | 3/2006 | Nakasho | H02J 7/0091 320/107 |
| 2007/0024236 A1* | 2/2007 | Arakelian | H01M 2/1072 320/107 |
| 2007/0090788 A1* | 4/2007 | Hansford | H01M 2/1055 320/107 |
| 2010/0008036 A1 | 1/2010 | Risher-Kelly | |

(Continued)

FOREIGN PATENT DOCUMENTS

| | | |
|---|---|---|
| CN | 1421942 A | 6/2003 |
| CN | 101584097 A | 11/2009 |

(Continued)

*Primary Examiner* — Samuel Berhanu
(74) *Attorney, Agent, or Firm* — Norton Rose Fulbright US LLP; Gerard Messina

(57) ABSTRACT

A battery charging device includes: at least one power electronics unit supplying a charging voltage; at least one cooling unit cooling the power electronics unit; and an electronics housing accommodating the at least one power electronics unit in at least one of water-tight and dust-tight manner. The electronics housing is cooled from the outside by a fan of the at least one cooling unit during at least one operating mode.

22 Claims, 6 Drawing Sheets

(56) References Cited

U.S. PATENT DOCUMENTS

| | | | | |
|---|---|---|---|---|
| 2011/0215752 A1* | 9/2011 | Waters | ............... | H01M 10/46 320/101 |
| 2012/0025766 A1* | 2/2012 | Reade | ............... | H02J 7/0042 320/110 |
| 2014/0191033 A1* | 7/2014 | Wojcik | ............... | G06K 7/082 235/449 |
| 2014/0340025 A1* | 11/2014 | Rief | ............... | H02J 7/0044 320/107 |
| 2015/0061571 A1* | 3/2015 | Lin | ............... | H02J 7/0044 320/107 |

FOREIGN PATENT DOCUMENTS

| | | |
|---|---|---|
| DE | 10 2007 042 398 | 3/2009 |
| EP | 1311012 | 5/2003 |
| EP | 1422983 | 5/2004 |
| WO | 2012147189 A | 11/2012 |

* cited by examiner

BATTERY CHARGING DEVICE

BACKGROUND OF THE INVENTION

1. Field of the Invention

The present invention relates to a battery charging device in which a battery is inserted into a battery charging container in which a power electronics unit is situated.

2. Description of the Related Art

Battery charging devices have already been provided in which a battery is inserted into a battery charging container in which a power electronics unit is situated. The provided battery charging devices are cooled by guiding an airflow, which is generated by a cooling fan, onto the battery.

BRIEF SUMMARY OF THE INVENTION

The present invention is directed to a battery charging device including at least one power electronics unit, which is at least provided to supply a charging voltage, at least one cooling unit for cooling the power electronics, and an electronics housing, which is provided for accommodating the at least one power electronics unit.

It is provided that the electronics housing accommodate the power electronics unit water-tight and/or dust-tight and that it is cooled from the outside by a fan of the at least one cooling unit during at least one operating mode.

A "battery charging device" is to be understood to mean in particular a device which is provided for charging an at least partly discharged battery and, for this purpose, to withdraw electrical energy in the form of current from a power line or a power source and transmit it to the battery. In particular, the battery charging device includes at least one current transformer unit which is designed to transform the withdrawn energy into charging voltage. The term "provided" is to be understood to mean in particular specifically programmed, designed, and/or equipped. That an object is provided for a particular function is to be understood in particular to mean that the object fulfills and/or executes this particular function at least in one application state and/or one operating state.

A "battery" is to be understood in particular to mean a rechargeable electrical energy storage device, which stores electrical energy within a storage medium with the aid of a reversible, chemical reaction. In principle, the battery may have multiple battery cells, which are connected in series, the battery voltage being made up of a sum of voltages in the multiple battery cells. A "power electronics unit" is to be understood to mean in particular a unit which includes the at least one current transformer unit and electronic units for sensing a state of charge of the inserted battery as well as for controlling a charging process. A "charging voltage" is to be understood to mean in particular a voltage which is used to charge the battery. In particular, the charging voltage is identical with the battery voltage with which the battery supplies current.

An "electronics housing" is to be understood to mean in particular a housing which at least in part delimits an electronics receiving space. The electronics housing is preferably designed as a cuboid housing. An "electronics receiving space" is to be understood to mean in particular a space, in which a power electronics unit is at least in part, preferably completely, accommodated. In particular, at least one power line element, which is provided to connect the at least one current transformer unit to a battery which is to be charged, is passed through the electronics housing. Preferably the at least one power line element connects the at least one current transformer unit and the battery interface.

"Delimiting at least in part" is to be understood to mean in particular that a housing has at least openings through which elements are passed toward a connection with an element, for example power supply elements or heat dissipation elements, which is accommodated in the space which is at least partially delimited by the housing, and/or through which an element, which is to be accommodated in a space, which is at least in part delimited by the housing, is introduced into the space which is at least in part delimited by the housing. "Receiving an element in a space" is to be understood to mean in particular that, in a received state, the element is introduced into the space to at least fifty percent of its entire volume.

"Water-protected and dust-protected" is to be understood to mean in particular that the electronics housing prevents at least in one operating mode water and/or dust from penetrating into the electronics receiving space. In particular, the electronics housing fulfills safety requirements corresponding to a protection class according to the so-called IP Code according to DIN EN 60529 of IP34, advantageously at least of IP35, preferably of at least IP55 and particularly preferably of at least IP67.

A "cooling unit" is to be understood to mean in particular a unit, which is provided for cooling a unit to be cooled using active cooling. "Active cooling" is to be understood to mean in particular a cooling method during which heat is dissipated from the unit to be cooled using energy, for example through circulation of a cooling medium, for example air or water, by cooling room air of a space surrounding the unit to be cooled, or by directly cooling the unit to be cooled, for example using a Peltier element. A "fan" is to be understood to mean in particular a unit including at least one ventilator which generates an airflow. That "the electronics housing is cooled from the outside by a fan of the at least one cooling unit during at least one operating mode" is to be understood to mean in particular that the fan is situated outside of the electronics receiving space and that the airflow is directed onto the electronics housing.

In particular, due to the design according to the present invention of the battery charging device, a safe and secure operation of the power electronics may be achieved, and, in particular, risk of damage to the power electronics unit through water and/or dust carried along in the airflow used for cooling may be avoided.

In a refinement of the present invention it is provided that the at least one electronics housing have at least one cover body and one principal body. A "cover body" is to be understood to mean in particular a preferably plate-shaped body which delimits a space at least partly on at least one side. A "principal body" is to be understood to mean in particular a body which at least partly delimits a space on at least two sides and preferably on all sides except for one side, which is delimited at least in part by the cover body. In particular, a simply constructed electronics housing which may be manufactured at low cost may be achieved.

Furthermore, it is provided that the fan cool the at least one cover body. Preferably, the cover body absorbs a majority of the waste heat of the power electronics unit so that cooling the cover body brings about a cooling of the power electronics unit. This may in particular achieve a concentration of the cooling performance.

Furthermore it is provided that the battery charging device include at least one heat transporting element which thermally joins the at least one cover body with the power electronics unit. A "heat transporting element" is to be understood to mean in particular an element which is provided to transport heat with the aid of thermal conductivity, thermal radiation or convection between two locations and which includes a heat transport capacity which is at least twice as high, advantageously at least four times as high, and preferably at least ten times as high, as a heat transport capacity of elements which surround the heat transporting element. The heat transporting element is, in particular, designed as a heat transporting element which has a thermal conductivity which is at least twice as large, advantageously at least four times as large, and preferably at least ten times as large as a thermal conductivity of elements which surround the heat transporting element, in particular such as a heat conductivity of the principal body. In particular, the at least one heat transporting element may be made of a metal. Preferably the at least one heat transporting element may be designed as a metal cooling body, for example made of aluminum. Alternatively, for example, a heat pipe may be used. In particular, heat dissipation for the power electronics unit may be achieved with a high heat transport performance while, at the same time, high heating of the components bordering the power electronics is avoided.

It is further provided that the at least one cover body include cooling fins. That "the at least one cover body include cooling fins" is to be understood to mean in particular that at least one body surface of the cover body has elevations, with the aid of which a surface area is enlarged compared with a flat surface area in order to achieve a higher heat emission and thus higher cooling of the cover body. A great heat emission of the cover body in particular may be achieved and great heating of the cover body through waste heat may be avoided.

Furthermore it is provided that the at least one electronics housing have at least one sealing unit which at least in part thermally decouples the at least one cover body and the principal body. "At least in part thermally decouples" is to be understood to mean in particular that the at least one sealing unit has a heat transport volume power density which is at most half the size, advantageously at most a fifth the size and preferably at most a tenth the size of the heat transport volume power density of the cover body and the principal body of the electronics housing so that thermal heat from the cover body or the principal body is only transferred to the principal body or the cover body after a long delay. In particular, cooling may be focused on a part of the body of the electronics housing at which a largest amount of heat accrues. In particular, a temperature difference between the at least one cover body and the principal body is at least in one operating mode, in which the battery charging device is operated at full capacity, approximately 10 degrees Celsius. The battery charging device is, in particular, provided to transfer waste heat accruing in the power electronics either to the cover body or to the principal body so that cooling may be better concentrated either on the cover body or on the principal body in order to prevent the power electronics from overheating. In particular, an easy heat management may be achieved.

Furthermore it is provided that the at least one fan is situated between the cover body and a battery receiving space. A "battery receiving space" is to be understood to mean in particular a space, which is provided to receive a battery, the battery receiving space having at least one battery interface, which is provided to transfer electrical energy to the battery to be charged. In particular, a battery to be recharged is charged when it is placed in the interface in a thus intended direction. "Receiving an element in a space" is to be understood to mean in particular that, in a received state, the element is introduced into the space to at least fifty percent of its entire volume. In particular, the at least one fan is situated in another space, which is delimited at least partly by a battery housing and which is at least partly separated from the battery receiving space by a wall element of the battery housing. Alternatively, the fan may be situated in the battery receiving space. Alternatively, the fan may be situated in the electronics receiving space, as seen in the direction toward the electronics receiving space, in front of the power electronics. Alternatively, the fan may be situated in an area, which, as seen from the battery receiving space, is situated behind the power electronics unit, either in the electronics receiving space or in a separate space. If the fan is situated inside the electronics receiving space within the water-tight and dust-tight electronics housing, it circulates air within the electronics housing in order to create a cooling effect. This may in particular achieve an advantageous routing of airflow.

Furthermore it is provided that the battery charging device include at least one airflow routing means, which guides air past a battery inserted into the at least one battery receiving space. The airflow routing means is preferably designed as a channel inside the battery housing; alternatively, an airflow routing means which is designed as a pipe is also conceivable. This may in particular achieve an advantageous routing of airflow.

Furthermore it is provided that the battery charging device include at least one locking means, which is provided to lock a battery inserted into a battery receiving space at least in one state of charge. A "state of charge" is to be understood to mean in particular an operating mode of the battery charging device in which a battery is charged. A "locking means" is to be understood to mean in particular a means which, at least in one operating mode, is in a form-fit engagement with the battery and which prevents movement on the part of the battery out of the battery receiving unit with this form-fit engagement. In particular, the battery which is to be charged may be secured against falling out accidentally.

Furthermore it is provided that the battery charging device include at least one battery interface, which has at least one bare contact element, for electrically contacting a battery. A "battery interface" is to be understood to mean in particular a unit having at least one contact area for a battery having at least one contact element, which contacts a corresponding contact element of the battery and establishes an electrically conductive connection to the corresponding contact element of the battery, this connection being used to transfer electrical power to charge the battery. A "bare contact element" is to be understood to mean in particular a contact element which is at least situated within a space essentially exposed and essentially free from any protective covering and/or protective coating against a short-circuit. "At least essentially free from any protective covering and/or protective coating" is to be understood to mean in particular that a maximum of sixteen square millimeters, advantageously a maximum of eight square millimeters, and preferably a maximum of four square millimeters of the surface of a contact element is covered by a protective covering and/or a protective coating. In particular, a bare contact element differs from a contact element which protrudes from a plug and which is provided for insertion into a plug connection. This may in particular achieve a high energy transmission capacity.

It is further provided that the at least one battery interface has openings for water drainage. "Openings for water drainage" are to be understood to mean in particular openings in the contact area through which water, which enters into the battery receiving space, may escape.

Furthermore it is provided that the battery charging device include at least one battery housing which is formed separately from the electronics housing, and which at least partly delimits a battery receiving space. A "battery housing" is to be understood in particular to mean a housing which at least in part delimits a battery receiving space. In particular, the battery housing may delimit at least in part one other space in addition to the at least one battery receiving space, a transformer element of the battery housing at least in part delimiting the at least one other space against the at least one battery receiving space. "Delimiting at least in part" is to be understood to mean in particular that a housing has at least openings through which elements are passed toward a connection with an element, for example power supply elements or heat dissipation elements, which is accommodated in the space which is at least partially delimited by the housing, and/or through which an element, which is to be accommodated in a space, which is at least in part delimited by the housing, is introduced into the space which is at least in part delimited by the housing.

Furthermore it is provided that the battery housing is at least partly, preferably entirely, made of a plastic material and that the electronics housing is made at least partly, preferably entirely, of metal. "Made at least partly of a material" is to be understood to mean in particular that at least seventy percent, advantageously at least eighty percent, preferably at least ninety percent, and particularly preferably one hundred percent of a mass of a material is made of this material. "Plastic material" is to be understood to mean in particular a pure material or a material mix of materials from the group of materials of plastics, such as, for example, polyethylene or polypropylene. "Metal" is to be understood to mean in particular a pure metal or an alloy. Preferably, the electronics housing is made of aluminum. In particular, the properties of the battery housing and the electronics housing may be adapted specifically to different requirements.

Furthermore it is provided that the battery charging device include a handle, which, on one side, is joined to the battery housing and, on the opposite side, is joined to the electronics housing. The handle is preferably at least partly designed as an elastic component; in principle, however, the handle may be designed as a rigid component.

In addition, a system including a battery charging device according to the present invention and an at least partly water-tight battery is provided. "An at least partly water-tight battery" is to be understood to mean in particular a battery which may be used after it has been entirely submerged in water and afterwards dried on the surface, and which provides a power during usage which is at most five percent less than the power provided before the submersion. This may in particular achieve a battery charge with a high operating safety.

The battery charging device according to the present invention is, however, not delimited to the applications and specific embodiment described above. Here, the battery charging device according to the present invention may in particular have a number of elements, components and units which deviates from the number given here to fulfill the functionality described here.

Further advantages result from the following description of the drawing. One exemplary embodiment of the present invention is illustrated in the drawing. The drawing, description, and claims contain numerous features in combination.

DETAILED DESCRIPTION OF THE INVENTION

Figure 1:
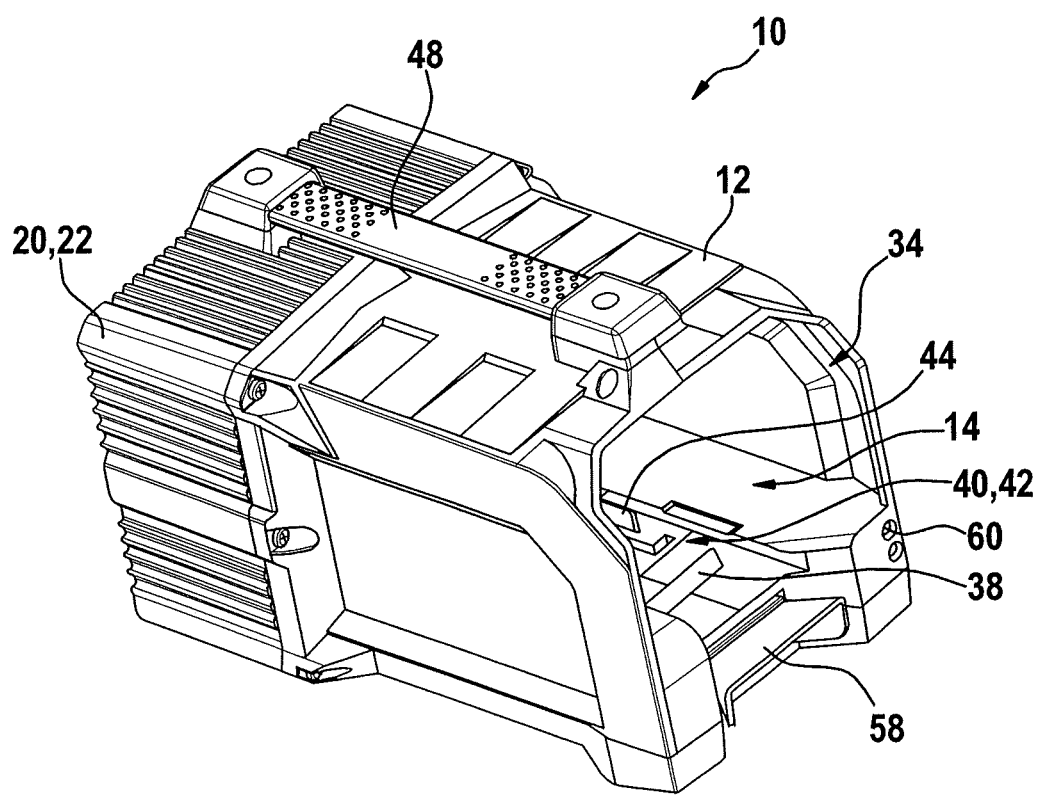
FIG. 1 shows an overall view of a battery charging device according to the present invention.
Figure 4:
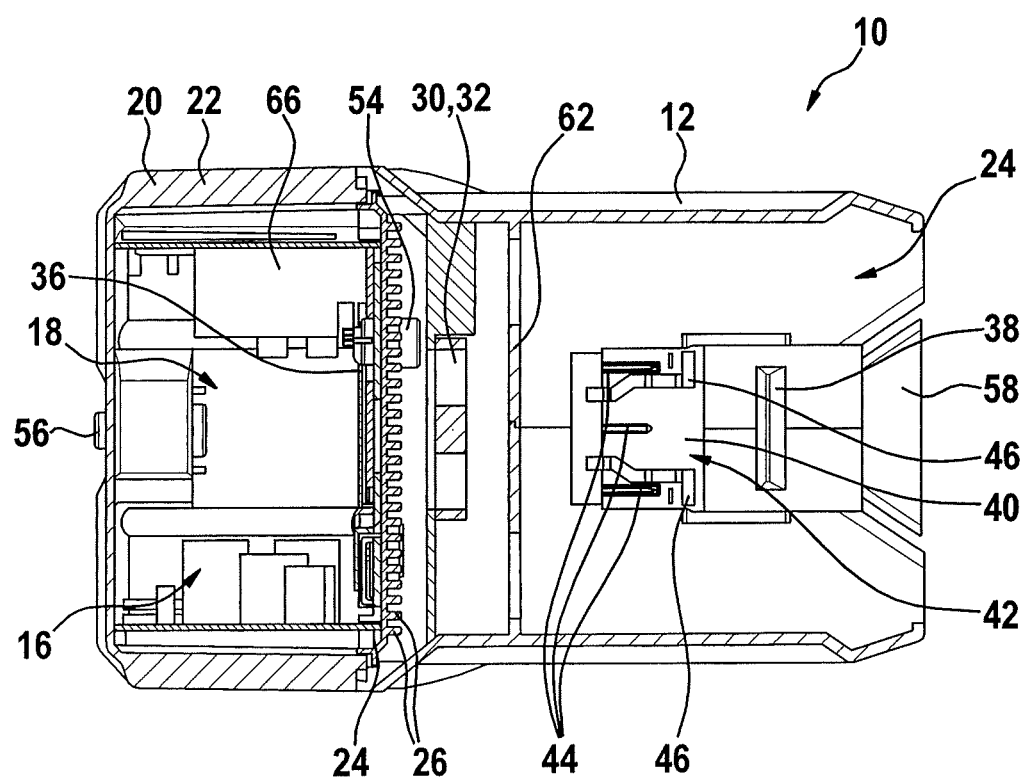
FIG. 4 shows a cross section in top view through the battery charging device according to the present invention.

FIG. 1 shows a battery charging device 10 including a battery housing 12, which partly delimits a battery receiving space 14, a power electronics unit 16 (concealed in FIG. 1, see FIG. 4) and including an electronics housing 20 which was formed separately from battery housing 12. Power electronics unit 16 is provided to supply a charging voltage for charging a battery. Electronics housing 20 accommodates power electronics unit 16 in a water-protected and dust-protected manner. The battery charging device has a cuboid shape with a length of twenty-seven centimeters, battery housing 12 and electronics housing 20 being arranged in series and having a maximum width of seventeen centimeters. On a bottom side of battery housing 12 and electronics housing 20, four feet 50 are situated in order to set up battery charging device 10 on a floor.

Electronics housing 20 fulfills safety requirements corresponding to a protection class according to the so-called IP code according to DIN EN 60529 of IP67, so that electronics housing 20 is dust-tight and protects contents against temporary submersion. Electronics housing 20 delimits an electronics receiving space 18 (see FIG. 4) into which power electronics unit 16 is introduced. Battery housing 12 is made of a plastic material and electronics housing 20 is made of metal.

Battery charging device 10 is intended for charging batteries for electrical equipment, such as, for example, lawn mowers, hand-held circular saws, percussion drills or the like, with a charging voltage of 36 V. Power electronics unit 16 includes a current transformer unit, which transforms the current from a power grid to the charging voltage, and includes electronic units for sensing a state of charge of a battery inserted into battery receiving space 14. The current from the power grid is supplied via a cable, which is passed through a water-tight, threaded screw-joint 56, which is formed by a so-called PG fitting, into an interior space of battery charging device 10.

The electronic units for sensing a state of charge of the inserted battery are connected to a display element 60, which is situated next to an opening of battery receiving space 14. Display element 60 is designed as an optical display element 60 and has two LEDs, which display the state of charge of the battery as well as the charging mode.

Battery charging device 10 is, in particular, intended to quickly charge the batteries immediately after an operation in a heated state and for this includes a cooling unit 30. Power electronics unit 16 of battery charging device 10 is dimensioned in such a way that a full charging of a battery is completed with a charge of four ampere hours within half an hour. Electronics housing 20 is cooled from the outside by a fan 32 of cooling unit 30 in an operating mode in which one or multiple batteries are charged.

Alternatively, battery charging device 10 may be provided to carry out two different charging modes, one normal charging mode, in which the battery is charged over several hours, and a rapid-charge mode, in which the battery is charged completely within a time period between twenty minutes and half an hour. In the rapid-charge mode, high power losses and thus high waste heat occur in power electronics unit 16 due to the occurring electrical loads, which are considerably higher than the electrical loads occurring in the normal charging mode.

Battery charging device 10 includes a handle 48, which is joined on one side to the battery housing 12, and, on the opposite side, is joined to the electronics housing 20. Handle 48 is designed as a flexible handle 48 made of a sheet metal with a rubber covering.

Figure 2:
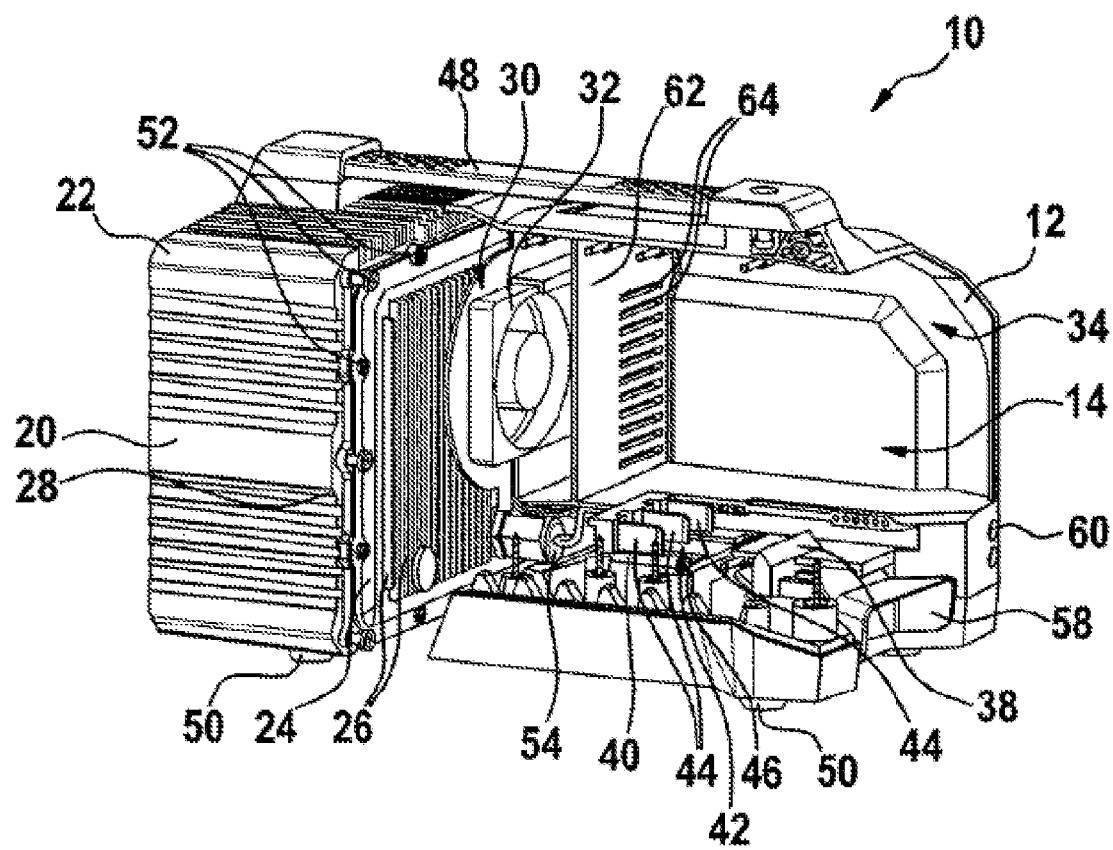
FIG. 2 shows a diagram of the battery charging device according to the present invention with an exposed battery receiving space.

One electronics housing 20 includes a cover body 24 and a principal body 22 (FIG. 2). Principal body 22 delimits from five sides an electronics receiving space 18 (FIG. 4), into which power electronics unit 16 is inserted. Electronics receiving space 18 is completely enclosed by cover body 24 and principal body 22. Principal body 24 and principal body 22 are joined to each other by screws 52. Principal body 22 forms an outer part, which may be touched by a user, of battery charging device 10. Cover body 24 has cooling fins 26, which protrude over an imaginary flat base surface and which enlarge a surface area of cover body 24. In this way, a heat-dissipating surface area is also enlarged, compared to a flat embodiment.

Figure 5:
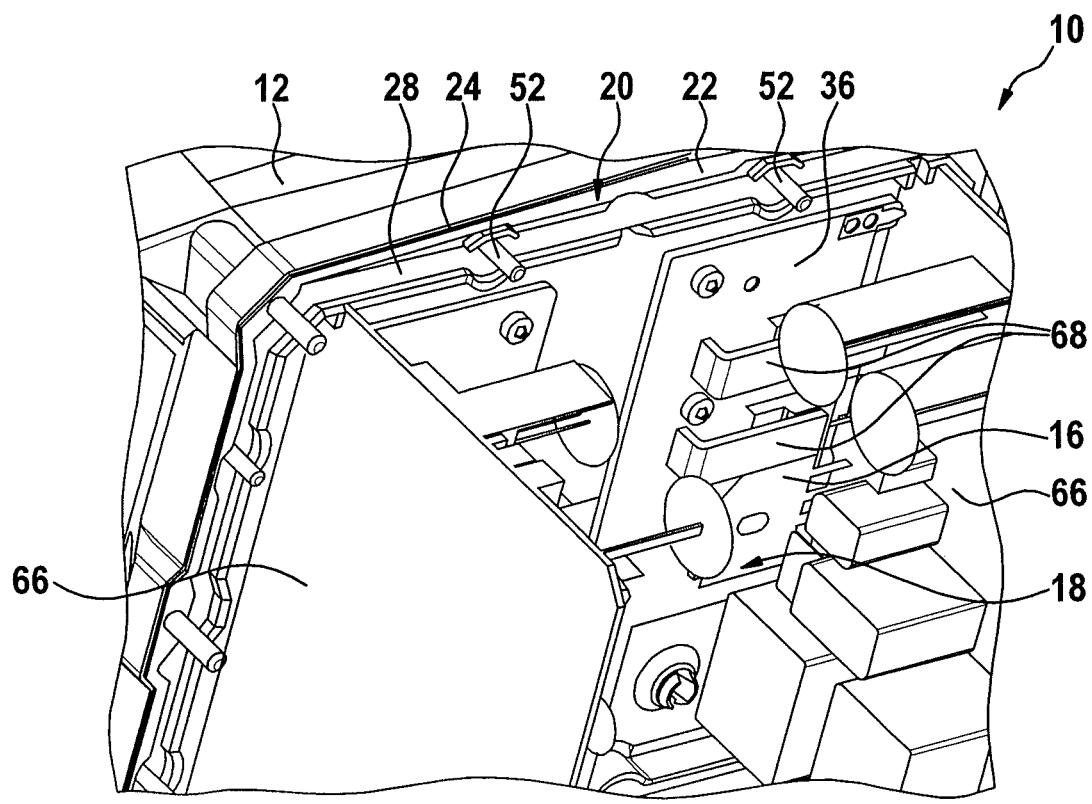
FIG. 5 shows a detail illustration of the power electronics unit of the battery charging device according to the present invention.
Figure 6:
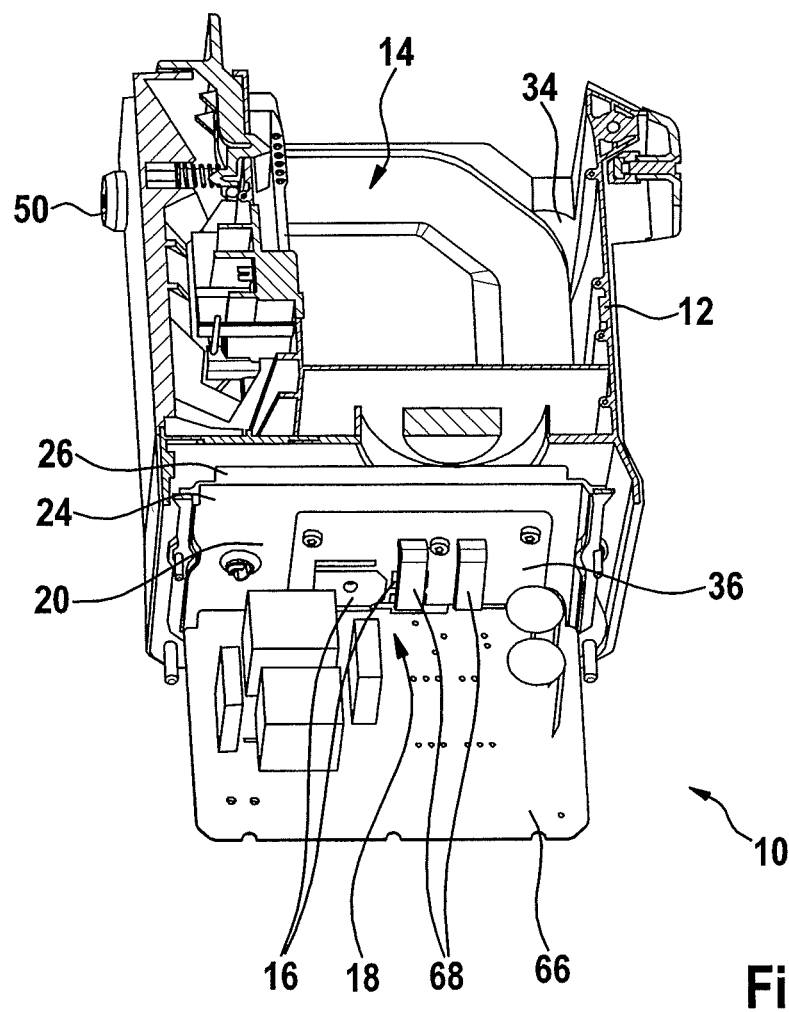
FIG. 6 shows a cross-sectional view of the battery charging device according to the present invention.

Electronics housing 20 has a sealing unit 28, which partly thermally decouples cover body 24 and principal body 22. Power elements of power electronics unit 16 are joined to two circuit boards 66. In another embodiment, the power elements of the power electronics unit 16 may also be joined to a single circuit board 66. A heat transporting element 36 (FIG. 5) thermally joins cover body 24 with power electronics unit 16. Heat transporting element 36 is formed by a cooling body made of aluminum. Press-on elements 68, which are formed by steel squares, press the power elements of power electronics unit 16 against heat transporting element 36 so that a high heat transfer is achieved. Screws 52 fix heat transporting element 36 to cover body 24 so that there is a direct contact with cover body 24 (FIG. 6). Heat transporting element 36 has a heat transporting capacity which is more than four times as large as the heat transporting capacity of surrounding components. Screws 52 have a lower heat transporting capacity than heat transporting element 36 so that a majority of the heat is dissipated via heat transporting element 36 to cover body 24. Due to sealing unit 28, which is designed as a rubber seal, the dissipated waste heat primarily occurs at cover body 24, and principal body 22 heats only slightly compared to cover body 24. In particular, the temperature difference during a state of charge between cover body 24 and principal body 22 is at least 10 degrees Celsius. Heating of principal body 22 of electronics housing 20 during a maximum power output of power electronics unit 16 is delimited to 50 degrees Celsius due to sealing unit 28 and cooling of cover body 24, so that principal body 22 of electronics housing 20 and thus outward lying components of battery charging device 10 may be touched briefly by a user without risk of injury.

Cooling unit 30 of battery charging device 10 includes a fan 32, which is provided to generate an airflow to cool electronics housing 20. Fan 32 is situated between cover body 24 and battery receiving space 14 in one other space which is partly divided from battery housing 14 by a wall element 62 of battery housing 12. Fan 32 cools electronics housing 20 in one operating mode from outside, the airflow being directed onto cover body 24. Wall element 62 has slot-shaped through-openings 64, through which fan 32 sucks in air from an exterior space. Battery charging device 10 has an airflow routing means 34, which guides air past a battery inserted into the at least one battery receiving space 14. Airflow routing means 34 is designed as a side channel, which is formed by a recessed subarea of battery housing 12. The airflow is guided onto cooling fins 26 of cover body 24 and dissipates the heat there. By heating the air sucked in by fan 32, a higher air extraction capacity is achieved.

In alternative embodiments of the present invention, the fan may be situated in battery receiving space 14, in electronics receiving space 18 in front of power electronics unit 16, as seen toward battery receiving space 14, in an area which is behind power electronics unit 16, as seen from battery receiving space 14, either inside electronics receiving space 18 or in a space which is separate from electronics receiving space 18.

Figure 3:
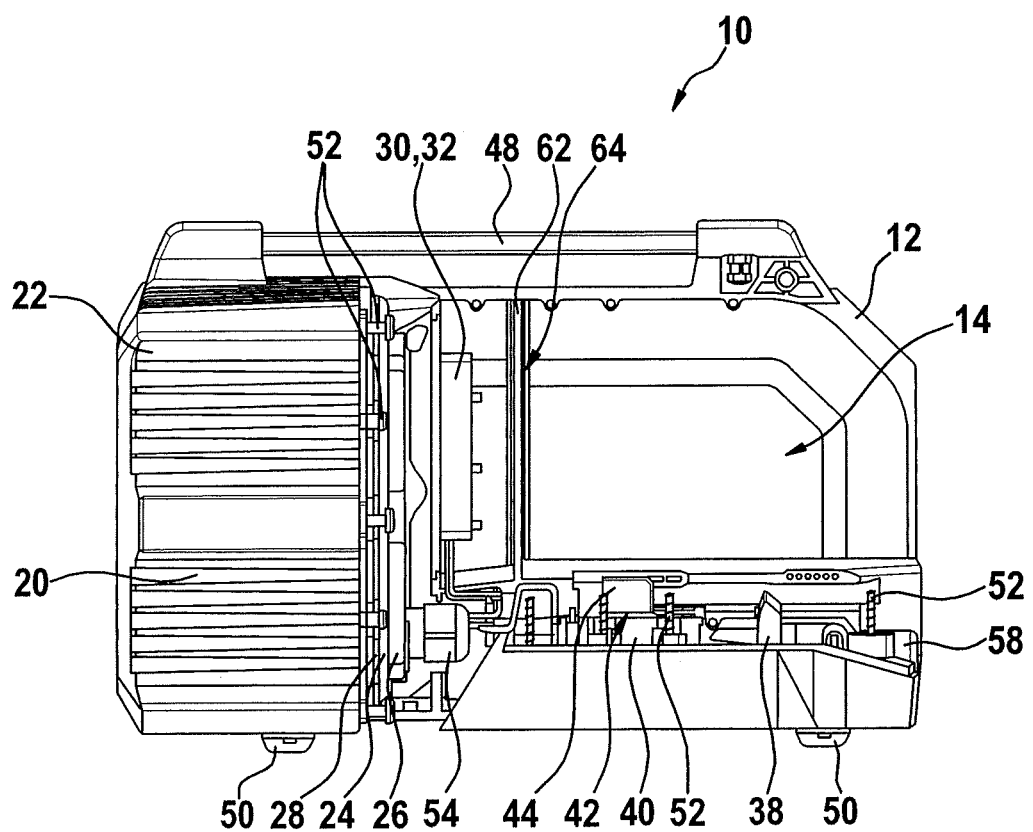
FIG. 3 shows another view of the battery charging device according to the present invention with an exposed battery receiving space.

Battery charging device 10 includes a locking means 38 (FIG. 3), which is provided to lock a battery inserted into a battery receiving space 14 in at least one state of charge. Locking means 38 is situated in battery receiving space 14 and establishes a force-fitting contact with a battery inserted in battery receiving space 14 so that the battery is fixed in a position. In particular, battery charging device 10 may be accommodated and moved without any risk of the battery falling out. Locking means 38 is mechanically connected to an actuator 58, which is situated at battery housing 12 next to the opening of battery receiving space 14. By pressing down actuator 58, locking means 38 is pulled into battery housing 12 so that the battery may be removed.

Battery charging device 10 includes a battery interface 40 situated inside battery receiving space 14 (see FIG. 4) for electrically contacting a battery. Three bare contact elements 44 are situated in a contact area 42 of battery interface 40. A charging current flows via contact elements 44 to a battery contacting contact elements 44. Battery interface 40 has a plastic base body, which is accommodated in a recess of battery housing 12, which is provided for this purpose, where it is fixed with screws 52. The battery interface 40 is connected via a power line element 54 to power electronics unit 16, and is supplied by power electronics unit 16 with power having the charging voltage. One branch of power line element 54 supplies fan 32 with power (FIG. 2). Battery interface 40 has openings for water drainage 46, which are introduced in the plastic base body and through which water is drained. The water flows through the openings for water drainage 46 into a cavity of battery housing 12, where it is drained through slots in a bottom of battery housing 12.

Battery charging device 10 may thus also be used safely when water enters battery receiving space 14, for example rain water, to charge an at least partly water-tight battery. Since electronics housing 20 is water-tight, power electronics unit 16 is protected against water penetrating battery receiving space 14. Fan 32 is also protected against water damage. Battery interface 40 has a battery insertion direction which is directed toward the one fan 32.

What is claimed is:

1. A battery charging device, comprising:
a power electronics unit supplying a charging voltage;
a cooling unit cooling the power electronics units; and
an electronics housing accommodating the power electronics unit, wherein the electronics housing surrounds the power electronics unit at least one of water-tight and dust-tight, and during at least one operating mode, the electronics housing is cooled from the outside by a fan of the cooling unit,
wherein the electronics housing includes at least one cover body and one principal body,
wherein the fan is situated outside of the cover body and the one principal body and between the cover body and a battery receiving space.

2. The battery charging device as recited in claim 1, wherein the fan cools the at least one cover body.

3. The battery charging device as recited in claim 1, wherein the electronics housing includes at least one heat transporting element which thermally connects the at least one cover body to the power electronics unit.

4. The battery charging device as recited in claim 1, wherein the at least one cover body has cooling fins.

5. The battery charging device as recited in claim 1, wherein the electronics housing includes at least one sealing unit, which at least partly thermally decouples the at least one cover body and the principal body.

6. The battery charging device as recited in claim 1, further comprising:
at least one airflow routing element which guides air past a battery inserted into a battery receiving space.

7. The battery charging device as recited in claim 6, further comprising:
at least one locking element which locks a battery inserted into the battery receiving space in at least one state of charge.

8. The battery charging device as recited in claim 1, further comprising:
at least one battery interface for electrically contacting a battery, which has at least one bare contact element.

9. The battery charging device as recited in claim 8, wherein the at least one battery interface has openings for water drainage.

10. The battery charging device as recited in claim 8, wherein the at least one battery interface has a battery insertion direction, which is directed toward the fan.

11. The battery charging device as recited in claim 1, further comprising:
a battery housing which is formed separately from the electronics housing and which at least partly delimits the battery receiving space.

12. The battery charging device as recited in claim 11, wherein the battery housing is made at least partly of a plastic material and the electronics housing is at least partly made from metal.

13. The battery charging device as recited in claim 11, further comprising:
a handle which is joined on one side to the battery housing and joined on the opposite side to the electronics housing.

14. The battery charging device as recited in claim 2, wherein the airflow of the fan is directed onto the cover body.

15. The battery charging device as recited in claim 1, wherein the electronics housing defines an electronics accommodating space configured to completely accommodate the power electronics unit.

16. The battery charging device as recited in claim 1, wherein the fan is situated in a space which is at least partly separated from the battery receiving space by a wall element.

17. The battery charging device as recited in claim 16, wherein the wall element includes air inlet or air outlet openings.

18. The battery charging device as recited in claim 1, wherein the cooling unit is configured to cool the power electronics units via circulation of a cooling medium.

19. The battery charging device as recited in claim 1, wherein the cooling unit is configured to cool the power electronics units via cooling a space surrounding the power electronics unit.

20. The battery charging device as recited in claim 1, wherein the cooling unit is configured to cool the power electronics units via directly cooling the power electronics unit.

21. The battery charging device as recited in claim 20, wherein the cooling unit is configured to directly cool the power electronics unit via a Peltier element.

22. A battery charging device, comprising:
a power electronics unit supplying a charging voltage;
a cooling unit cooling the power electronics units; and
an electronics housing accommodating the power electronics unit, wherein the electronics housing surrounds the power electronics unit at least one of water-tight and dust-tight, and during at least one operating mode, the electronics housing is cooled from the outside by a fan of the cooling unit, and
a battery housing which is formed separately from the electronics housing and which at least partly delimits a battery receiving space, wherein the battery housing includes at least one battery interface for electrically contacting a battery, which has at least one bare contact element,
wherein the battery receiving space includes at least one airflow routing element which guides air past a battery inserted into a battery receiving space, wherein the at least one battery interface has a battery insertion direction, which is directed toward the fan,
wherein the electronics housing includes at least one cover body and one principal body,
wherein the at least one cover body has cooling fins.

* * * * *